US011658263B2

(12) United States Patent
Park et al.

(10) Patent No.: US 11,658,263 B2
(45) Date of Patent: May 23, 2023

(54) METHOD OF FABRICATING A LIGHT EMITTING DEVICE HAVING A STACKED STRUCTURE

(71) Applicant: SEOUL VIOSYS CO., LTD., Gyeonggi-do (KR)

(72) Inventors: Ji Hoon Park, Gyeonggi-do (KR); Ji Hun Kang, Gyeonggi-do (KR); Chae Hon Kim, Gyeonggi-do (KR); Yong Hyun Baek, Gyeonggi-do (KR); Hyo Shik Choi, Gyeonggi-do (KR)

(73) Assignee: Seoul Viosys Co., Ltd., Gyeonggi-do (KR)

( * ) Notice: Subject to any disclaimer, the term of this patent is extended or adjusted under 35 U.S.C. 154(b) by 162 days.

(21) Appl. No.: 17/193,443

(22) Filed: Mar. 5, 2021

(65) Prior Publication Data

US 2021/0280738 A1    Sep. 9, 2021

Related U.S. Application Data

(60) Provisional application No. 62/987,132, filed on Mar. 9, 2020.

(51) Int. Cl.
    *H01L 21/66*    (2006.01)
    *H01L 33/00*    (2010.01)

(52) U.S. Cl.
    CPC .......... *H01L 33/0095* (2013.01); *H01L 22/20* (2013.01)

(58) Field of Classification Search
    None
    See application file for complete search history.

(56) References Cited

U.S. PATENT DOCUMENTS

2013/0288404 A1    10/2013    Nonomura
2021/0280738 A1*    9/2021    Park ........................ H01L 22/20

FOREIGN PATENT DOCUMENTS

| KR | 1020050032240 A | 4/2005 |
|----|-----------------|--------|
| KR | 1020090083384 A | 8/2009 |
| KR | 101593643 B1    | 2/2016 |
| WO | 2016064697 A1   | 4/2016 |

OTHER PUBLICATIONS

International Search Report for corresponding International Application No. PCT/KR2021/002841, dated Jun. 29, 2021, 2 pages.

* cited by examiner

*Primary Examiner* — Jack S Chen
(74) *Attorney, Agent, or Firm* — LaBatt, LLC

(57) ABSTRACT

A method of fabricating a light emitting device includes (i) determining whether each measurement location is defective or not based on a measurement result of the emission wavelength of each location, (ii) forming a test stacked structure by combining one of the first wafers, one of the second wafers, and one of the third wafers in a set of wafers, and (iii) calculating a combination yield of the test stacked structure based on a count of defective measurement locations that overlap in the test stacked structure.

17 Claims, 6 Drawing Sheets

|     | RG  | BG  | GG  | Yd  |
| --- | --- | --- | --- | --- |
| C1  | R1  | B1  | G1  | Y1  |
| C2  | R2  | B2  | G2  | Y2  |
| C3  | R3  | B3  | G3  | Y3  |
| C4  | R4  | B4  | G4  | Y4  |
| C5  | R5  | B5  | G5  | Y5  |
| C6  | R6  | B6  | G6  | Y6  |
| C7  | R7  | B7  | G7  | Y7  |
| C8  | R8  | B8  | G8  | Y8  |
| C9  | R9  | B9  | G9  | Y9  |
| C10 | R10 | B10 | G10 | Y10 |
| C11 | R11 | B11 | G11 | Y11 |
| C12 | R12 | B12 | G12 | Y12 |
| Sum |     |     |     | Yt1 |

FIG. 6B

|  | RG | BG | GG | Yd |
|---|---|---|---|---|
| C1 | R1 | B2 | G1 | Y1 |
| C2 | R2 | B3 | G2 | Y2 |
| C3 | R3 | B4 | G3 | Y3 |
| C4 | R4 | B5 | G4 | Y4 |
| C5 | R5 | B6 | G5 | Y5 |
| C6 | R6 | B7 | G6 | Y6 |
| C7 | R7 | B8 | G7 | Y7 |
| C8 | R8 | B9 | G8 | Y8 |
| C9 | R9 | B10 | G9 | Y9 |
| C10 | R10 | B11 | G10 | Y10 |
| C11 | R11 | B12 | G11 | Y11 |
| C12 | R12 | B1 | G12 | Y12 |
| Sum |  |  |  | Yt2 |

METHOD OF FABRICATING A LIGHT EMITTING DEVICE HAVING A STACKED STRUCTURE

CROSS-REFERENCE OF RELATED APPLICATIONS AND PRIORITY

The Present Application is a Non-provisional Application which claims the benefit of the filing date of U.S. Provisional Application Ser. No. 62/987,132 filed Mar. 9, 2020, the disclosure of which is incorporated herein by reference in their entirety.

TECHNICAL FIELD

The present disclosure relates to a method of fabricating a light emitting device, and in particular, to a method of fabricating a light emitting device having a stacked structure.

BACKGROUND

As an inorganic light source, light emitting diodes have been used in various fields including displays, vehicular lamps, general lighting, and the like. With various advantages such as long lifespan, low power consumption, and rapid response, light emitting diodes have been replacing existing light sources in the art.

Light emitting diodes have been used as backlight light sources in display apparatuses. However, LED displays that directly realize images using the light emitting diodes have been recently developed.

In general, a display apparatus realizes various colors through mixture of blue, green and red light. In order to realize various images, the display apparatus includes a plurality of pixels, each of which has subpixels corresponding to blue, green and red light, respectively. A color of a certain pixel is determined based on the colors of the sub-pixels so that images can be realized through combination of such pixels.

Since LEDs can emit various colors depending upon materials thereof, it is possible to provide a display apparatus by arranging individual LED chips emitting blue, green and red light on a two-dimensional plane. However, when one LED chip is arranged in each sub-pixel, the number of LED chips may increase, which may require excessive time for a mounting process during fabrication.

Recently, in order to solve disadvantages of a conventional LED display in which subpixels are arranged on a two-dimensional plane, a light emitting device having a stacked structure in which subpixels of various colors are stacked in the vertical direction has been developed. The light emitting device having a stacked structure is fabricated by stacking a plurality of wafers for implementing light of different colors.

Figure 1:
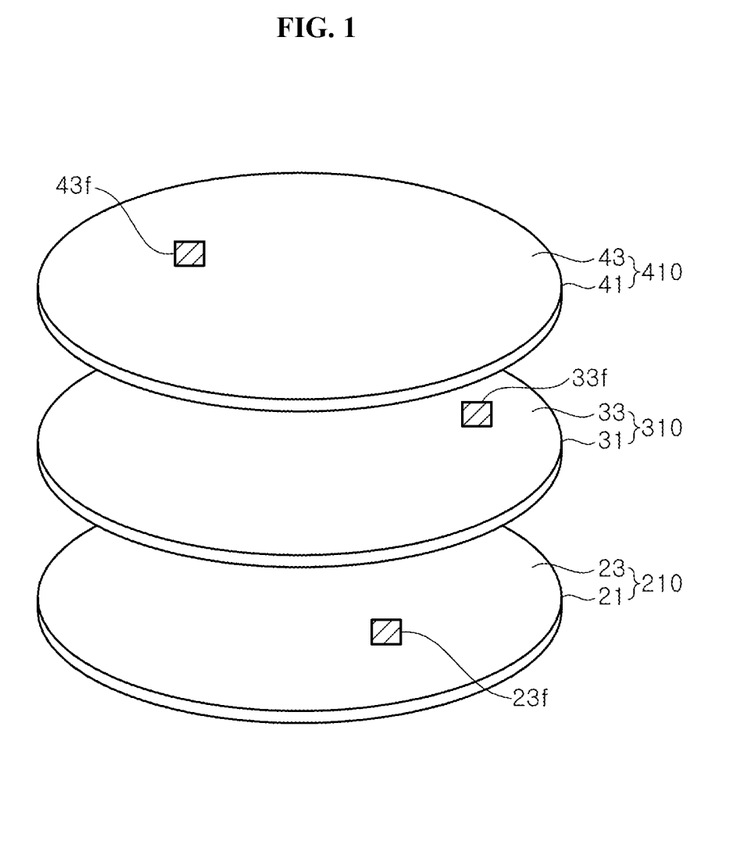
FIG. 1 is a schematic perspective view illustrating a method of fabricating a light emitting device having a stacked structure according to the related art.

FIG. 1 is a schematic perspective view illustrating a method of fabricating a light emitting device having a stacked structure according to the related art.

Referring to FIG. 1, a first wafer 210, a second wafer 310, and a third wafer 410 are prepared. The first wafer 210 includes a first substrate 21 and a first LED stack 23, the second wafer 310 includes a second substrate 31 and a second LED stack 33, and the third wafer 410 includes a third substrate 41 and a third LED stack 43.

Thereafter, the first wafer 210, the second wafer 310, and the third wafer 410 are stacked to fabricate a light emitting device. Accordingly, the light emitting device has a structure in which the first LED stack 21, the second LED stack 33, and the third LED stack 43 are stacked.

Meanwhile, since the first, second, and third wafers 210, 310, and 410 are stacked on one another to fabricate the light emitting device, the light emitting devices fabricated by stacking the first, the second and the third wafers 210, 310, and 410 have a lower yield than that of each of the wafers 210, 310, and 410. In particular, as illustrated in FIG. 1, since defective locations 23f, 33f, and 43f in the wafers 210, 310, and 410 are different from one another, the light emitting devices fabricated by stacking these wafers has a considerably low yield. Accordingly, due to the defective location of one wafer, the light emitting device including favorable locations of the other wafers is discarded, resulting in a large loss.

SUMMARY

Exemplary embodiments provide a method of fabricating a light emitting device having a stacked structure for increasing a process yield of the fabrication.

In one or more embodiments according to the teachings of the present disclosure, a method of fabricating a light emitting device having a stacked structure is provided. The method includes (i) measuring an emission wavelength for each predetermined measurement location of each wafer in a first group of wafers. The first group of wafers includes a plurality of first wafers, a plurality of second wafers, and a plurality of third wafers, and a set of wafers comprises at least one of the first wafers, at least one of the second wafers, and at least one of the third wafers. The method further includes (ii) determining whether each measurement location is defective or not based on a measurement result of the emission wavelength of each location, (iii) forming a test stacked structure by combining said one of the first wafers, said one of the second wafers, and said one of the third wafers in the set of wafers, (iv) calculating a combination yield of the test stacked structure based on a count of defective measurement locations that overlap in the test stacked structure, (v) selecting one or more resultant combinations of the first, the second and the third wafers by comparing each combination yield of the test stacked structure, and (vi) performing a subsequent process using the resultant combinations of the first, the second and the third wafers. The subsequent process includes forming a final stacked structure with the selected resultant combinations of first, the second and the third wafers.

In at least one variant, the method further includes performing the subsequent process on the combinations of first, the second and the third wafers, where each combination has a combination yield greater than or equal to a reference value.

In another variant, the method further includes determining each yield of each wafer in the first group based on the measurement result of the emission wavelength of each location.

In another variant, determining whether each location is defective or not further includes determining whether or not the measurement result of the emission wavelength of each location is in a preset range from a target wavelength. Measuring the emission wavelength further comprises measuring the emission wavelength using photoluminescence.

In another variant, the method further includes sorting the plurality of first wafers to follow a selected order. Forming the test stacked structure further includes forming the test stacked structure by combining each first wafer following the sorted order with each second wafer and each third wafer selected in random order, respectively.

In at least one variant, the method further includes preparing the first group of wafers including a total of n first wafers, a total of m second wafers, and a total of k third wafers. Here, n, m and k are natural numbers greater than zero. Where m and k are equal to n, forming the test stacked structure further includes forming the test stacked structure that include $(n!)^2$ different combinations of the first wafers, the second wafers, and the third wafers. Calculating the combination yield of the test stacked structure further includes calculating the combination yield of all or a part of the $(n!)^2$ different combinations based on the count of defective measurement locations that overlap in each test stacked structure.

In another variant, selecting the resultant combinations further comprises comparing the combination yield for all or a part of the $(n!)^2$ different combinations of the first wafers, the second wafers, and the third wafers.

In further another variant, the method further comprises calculating total combination yield Yt by summing the combination yield of all of a part of the $(n!)^2$ different combinations of the first wafers, the second wafers, and the third wafers.

In another variant, selecting the resultant combinations further comprises selecting the resultant combinations of the first, the second and the third wafers in the order of a highest combination yield.

In further another variant, where m is greater than n, selecting the set of wafers from the first group of wafers further comprises selecting n sets of wafers from the first group of wafers, calculating the combination yield of the test stacked structure based on the n sets of wafers, selecting (m−n) sets of wafers from the first group of wafers, and calculating the combination yield of the test stacked structure based on the (m−n) sets of wafers.

In another variant, the method further includes preparing a second group of wafers including wafers of identical types to types of the first group of wafers, measuring the emission wavelength for each predetermined measurement location of each wafer in the second group, forming another test stacked structure by combining a portion of the wafers in the first group and the wafers in the second group, and calculating combination yields of another test stacked structure based on a count of defective measurement locations that overlap in another test stacked structure.

In one or more embodiments according to the teachings of the present disclosure, a computer-readable storage medium, storing a computational program for calculating combination yields of first wafers, second wafers, and third wafers in a first group, on the basis of the data on whether locations on each wafer in the first group of wafers including a group of first wafers, a group of second wafers, and a group of third wafers is defective or not, respectively. The computational program, upon execution by a processor, is configured to perform operations, comprising determining whether or not a measurement result of an emission wavelength for each predetermined measurement location of each wafer is in a preset range from a target wavelength, upon determination that the measurement result is outside of the preset range from the target wavelength, determining that a corresponding measurement location to the measurement result has a defect, and calculating a combination yield of a test stacked structure based on a count of overlapping defective measurement locations in the test stacked structure. The test stacked structure includes a first wafer, a second wafer, and a third wafer, selected from each group and combined in each different predetermined order. The operation further includes determining a resultant combination of the first wafer, the second wafer and the third wafer by comparing each combination yield of each test stacked structure.

In at least one variant, the operations further comprise determining each yield of each wafer in the first group based on presence or absence of the defect on each wafer.

In another variant, the group of first wafers comprises a total n of first wafers; the group of second wafers comprises a total m of second wafers; and the group of third wafers comprises a total k of third wafers, where n, m, and k are natural numbers and greater than zero. Where n, m, and k are an identical number, the operations further include calculating the combination yield of the test stacked structure that include $(n!)^2$ different combinations of the first wafers, the second wafers, and the third wafers.

In one or more embodiments according to the teachings of the present disclosure, a method of fabricating a light emitting device having a stacked structure according to an exemplary embodiment includes (i) preparing a first group of wafers including at least two types of wafers, (ii) measuring an emission wavelength for each location of each wafer in the first group, (iii) calculating combination yields of the wafers in the first group based on the measurement result, (iv) determining combinations of wafers based on the combination yields, and (v) performing a subsequent process using the determined combinations of wafers.

In another embodiment, a computer-readable storage medium stores a computational program for calculating combination yields of first wafers, second wafers, and third wafers in a first group, on the basis of the data on whether locations on each wafer in the first group of wafers including a group of first wafers, a group of second wafers, and a group of third wafers are defective or not, respectively.

DETAILED DESCRIPTION OF EMBODIMENTS

Hereinafter, embodiments will be described in detail with reference to the accompanying drawings. The following embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of devices can be exaggerated for clarity and descriptive purposes. When an element or layer is referred to as being "disposed above" or "disposed on" another element or layer, it can be directly "disposed above" or "disposed on" the other element or layer or intervening devices or layers can be present. Throughout the specification, like reference numerals denote like devices having the same or similar functions.

In one or more embodiments according to the teachings of the present disclosure, a method of fabricating a light emitting device includes (i) determining whether each measurement location is defective or not based on a measurement result of the emission wavelength of each location, (ii) forming a test stacked structure by combining one of the first wafers, one of the second wafers, and one of the third wafers in a set of wafers, and (iii) calculating a combination yield of the test stacked structure based on a count of defective measurement locations that overlap in the test stacked structure In one or more embodiments according to the teachings of the present disclosure, a method of fabricating a light emitting device having a stacked structure includes preparing a first group of wafers including at least two types of wafers, measuring an emission wavelength for each location of each wafer in the first group, calculating combination yields of the wafers in the first group based on the measurement result, determining combinations of wafers based on the combination yields, and performing a subsequent process using the determined combinations of wafers.

Before performing the process, an optimum combination may be derived by pre-calculating combination yields of a plurality of wafers, and thus, a yield of fabricating a light emitting device may be improved.

In at least one variant, the first group of wafers may include first wafers each having a first substrate and a first LED stack grown on the first substrate, second wafers each having a second substrate and a second LED stack grown on the second substrate, and third wafers each having a third substrate and a third LED stack grown on the third substrate. The first, second, and third LED stacks may be configured to emit light of different colors from one another.

In another variant, the first LED stack may be configured to emit red light, the second LED stack may be configured to emit blue light, the third LED stack may be configured to emit green light, and the second LED stack may be disposed between the first LED stack and the third LED stack.

In further another variant, the first LED stack may be configured to emit red light, the second LED stack may be configured to emit green light, the third LED stack may be configured to emit blue light, and the second LED stack may be disposed between the first LED stack and the third LED stack.

In further another variant, calculating the combination yields of the first group of wafers may include calculating total combination yields Yt according to all combinations of the wafers in the first group, and determining combinations of wafers based on the combination yields may be determined with a maximum combination yield among the total combination yields.

In another variant, calculating combination yields of the first group of wafers may include fixing an order of one type of wafers in advance, and combination yields with other types of wafers may be calculated in the order of one type of wafers.

In further another variant, determining combinations of wafers based on the combination yields may be determined in order of high combination yield with other types of wafers in the order of one type of wafers.

In some forms, the subsequent process may be performed for all combinations of wafers. In other forms, the subsequent process may be performed on combinations each having a combination yield greater than or equal to a reference value among all combinations of wafers.

In one form, the reference value may be about 50%, about 60%, or about 70%.

In one or more embodiments according to the teachings of the present disclosure, the method of fabricating the light emitting device may include preparing a second group of wafers including wafers of identical types as those of the first group of wafers, measuring an emission wavelength for each location of each wafer in the second group, calculating combination yields of a portion of wafers in the first group and the wafers in the second group based on the measurement result, determining combinations of wafers based on the combination yields, and performing a subsequent process on the portion of wafers in the first group and the wafers in the second group using the determined combinations of wafers.

In at least one variant, the subsequent process may be performed on combinations each having a combination yield greater than or equal to a reference value among all combinations of wafers.

The portion of wafers in the first group may be at least a portion of wafers having combination yields less than the reference value among the combinations of the first group of wafers.

Calculating combination yields of the wafers in the first group may be performed using a computational program.

The computational program may be stored in a computer-readable recording medium.

In another variant, a yield of each wafer may be calculated by determining whether each location is defective or not from the measurement result of an emission wavelength of each location. Furthermore, whether each location is defective or not may be determined in a preset range from a target wavelength.

The emission wavelength may be measured using photoluminescence.

In one or more embodiments according to the teachings of the present disclosure, a computer-readable storage medium stores a computational program for calculating combination yields of first wafers, second wafers, and third wafers in a first group, on the basis of the data on whether locations on each wafer in the first group of wafers including a group of first wafers, a group of second wafers, and a group of third wafers are defective or not, respectively.

In at least one variant, the computational program may calculate combination yields for all combinations of the first wafers, the second wafers, and the third wafers.

In another variant, the computational program may fix an order of any one of the first wafers, the second wafers, and the third wafers, and combination yields of the first wafers, the second wafers, and the third wafers may be calculated according to the fixed order of the wafers.

Hereinafter, exemplary embodiments of the present disclosure will be described in detail with reference to the accompanying drawings.

Figure 2:
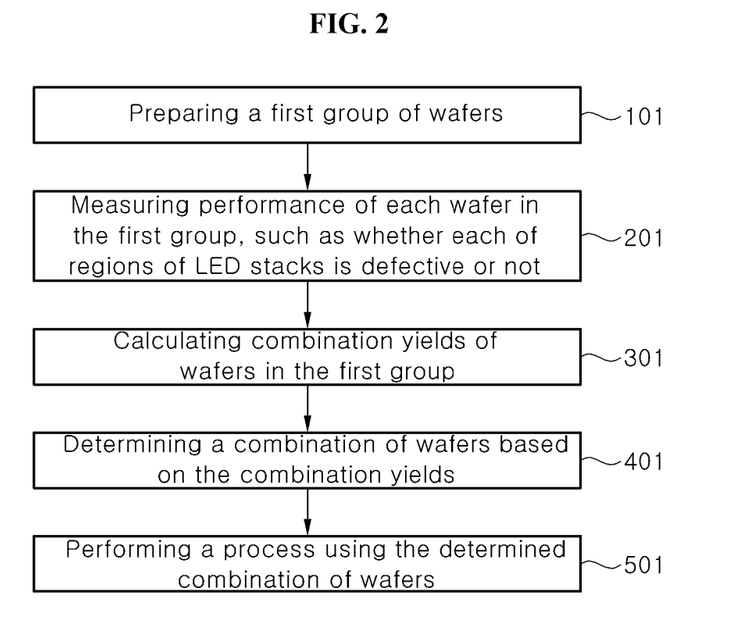
FIG. 2 is a schematic flowchart illustrating a method of fabricating a light emitting device having a stacked structure according to one or more embodiments of the present disclosure.
Figure 3:
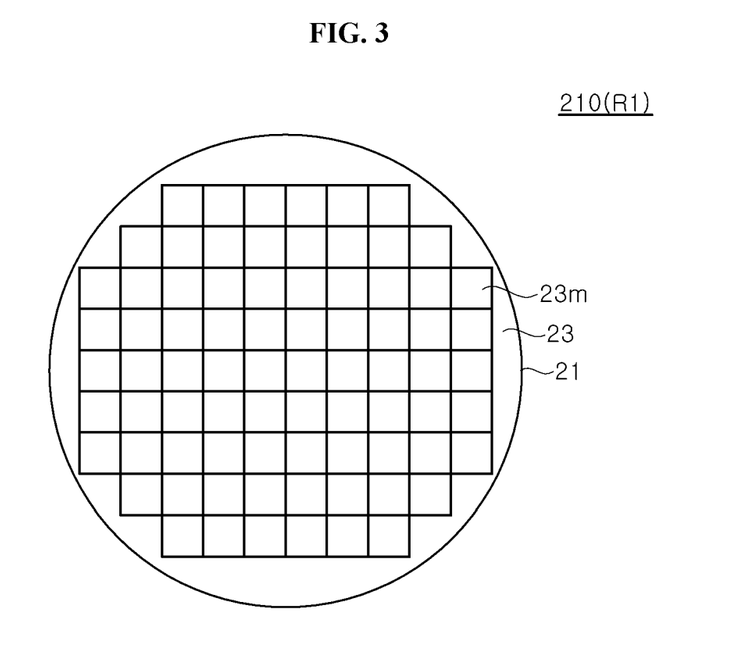
FIG. 3 is a schematic plan view illustrating a mapping process of a first wafer.
Figure 4:
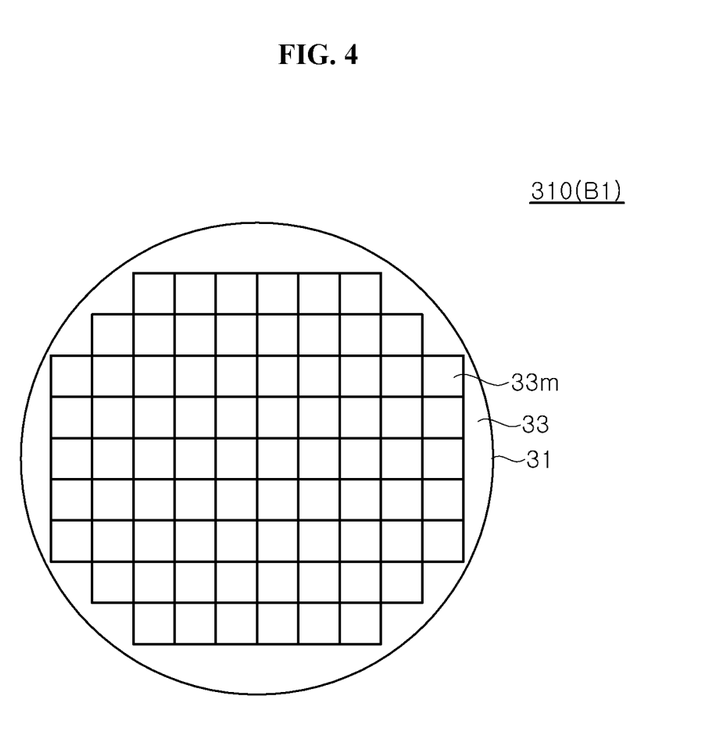
FIG. 4 is a schematic plan view illustrating a mapping process of a second wafer.
Figure 5:
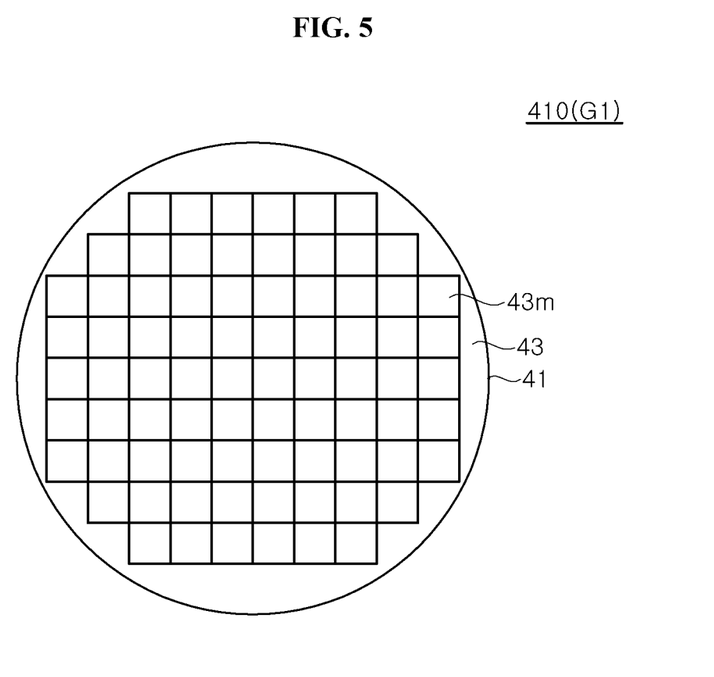
FIG. 5 is a schematic plan view illustrating a mapping process of a third wafer.
Figure 6A:
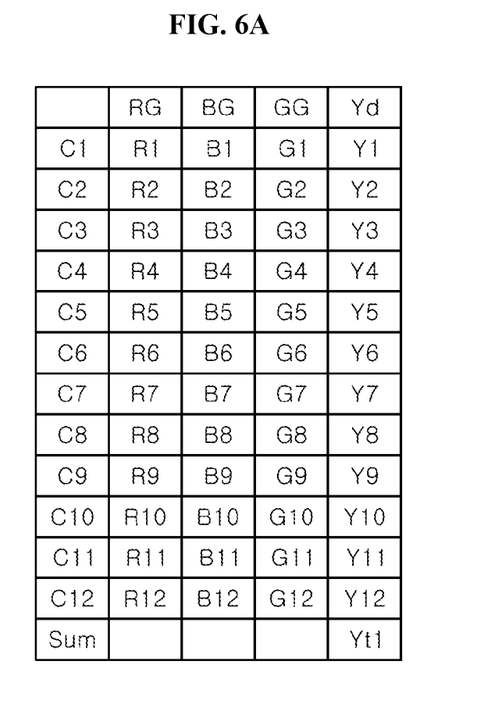
FIG. 6A is a table for showing one example of combination yields according to combinations of wafers.
Figure 6B:
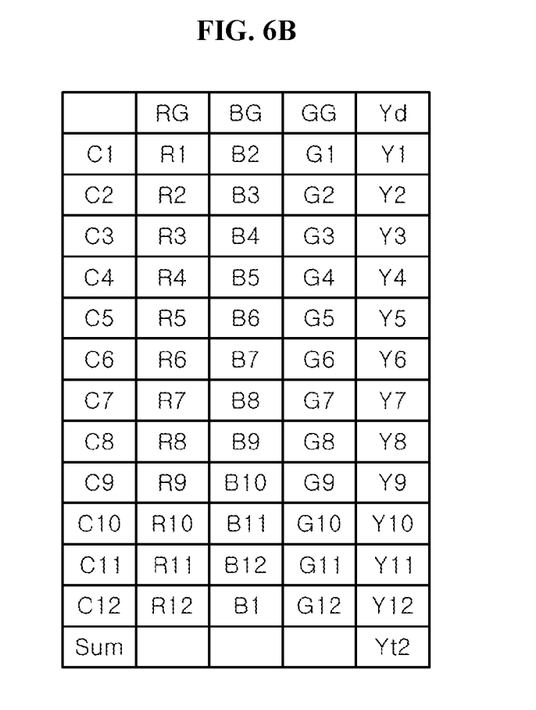
FIG. 6B is a table for showing another example of combination yields according to combinations of wafers.

FIG. 2 is a schematic flowchart illustrating a method of fabricating a light emitting device having a stacked structure according to one or more embodiments, and FIGS. 3 through 5 are schematic plan views illustrating a mapping process of first, second, and third wafers, respectively, and FIGS. 6A and 6B are tables for showing yields according to combinations of wafers.

(Step 101)

Referring to FIG. 2, first, in Step 101, a first group of wafers is prepared. The first group of wafers may include, for example, a plurality of first wafers, a plurality of second wafers, and a plurality of third wafers. A first wafer 210 is shown in FIG. 3, a second wafer 310 is shown in FIG. 4, and a third wafer 410 is shown in FIG. 5. Although only one first wafer R1, only one second wafer B1, and only one third wafer G1 are shown in FIGS. 3, 4, and 5, respectively, there will be provided a plurality of first wafers, a plurality of second wafers, and a plurality of third wafers. By way of example, there may be twelve (12) first wafers, twelve (12) second wafers and twelve (12) third wafers, a total of thirty six (36) wafers. A plurality of first wafers 210, a plurality of second wafers 310, and a plurality of third wafers 410 may be prepared and designated as the first group. Using the above example, the first group may include a total of thirty six (36) wafers. Herein, although the first group is described as including three types of wafers by way of example, the inventive concepts are not limited to three types thereof. For example, the first group may include two types of wafers, or may include four or more types of wafers.

The number of each of the first, second, and third wafers 210, 310, and 410 included in the first group may be identical to one another, but it is not limited thereto and may be different from one another. For example, the plurality of first wafers 210 may be wafers on which a growth process has been performed together in one growth apparatus. These wafers are provided through an identical run. Similarly, the plurality of second wafers 310 may also be wafers on which a growth process has been performed together in one growth apparatus, and the plurality of third wafers 410 may also be wafers on which a growth process has been performed together in one growth apparatus. However, the inventive concepts are not limited thereto. For example, the first group includes the first wafers 210, the second wafers 310, or the third wafers 410 grown multiple times in one growth apparatus or grown in multiple growth apparatuses. That is, the first group of wafers may be provided through multiple runs by the same or different growth apparatuses. For convenience of description, it will be described that twelve (12) first wafers 210, twelve (12) second wafers 310, and twelve (12) third wafers 410 are included in the first group, in the following exemplary embodiment. However, as described above, the number of wafers included in the first group is not limited thereto, and may be smaller or greater than 12.

Meanwhile, each of the first wafers 210 includes a first LED stack 23 grown on a first substrate 21, each of the second wafers 310 includes a second LED stack 33 grown on a second substrate 31, and each of the third wafers 410 includes a third LED stack 43 grown on a third substrate 41.

FIG. 3 is a schematic plan view illustrating a mapping process of a first wafer. FIG. 4 is a schematic plan view illustrating a mapping process of a second wafer. FIG. 5 is a schematic plan view illustrating a mapping process of a third wafer.

The first LED stack 23 may emit light of a longer wavelength than those of light emitted from the second and third LED stacks 33 and 43, and the second LED stack 33 may emit light of a longer wavelength than that of light emitted from the third LED stack 43. For example, the first LED stack 23 may be an inorganic light emitting diode emitting red light, the second LED stack 33 may be an inorganic light emitting diode emitting green light, and the third LED stack 43 may be an inorganic light emitting diode emitting blue light.

In another exemplary embodiment, to adjust a color mixing ratio of light emitted from the first, second, and third LED stacks 23, 33, and 43, the second LED stack 33 may emit light of a shorter wavelength than that of light emitted from the third LED stack 43. Accordingly, luminous intensity of light emitted from the second LED stack 33 may be reduced and luminous intensity of light emitted from the third LED stack 43 may be increased. For example, the first LED stack 23 may be configured to emit red light, the second LED stack 33 may be configured to emit blue light, and the third LED stack 43 may be configured to emit green light.

Hereinafter, although it is exemplarily described that the second LED stack 33 emits light of a shorter wavelength than that of light emitted from the third LED stack 43, for example, blue light, but it should be noted that the second LED stack 33 may emit light of a longer wavelength than that of light emitted from the third LED stack 43, for example, green light.

Each of the first, second, and third LED stacks 23, 33, and 43 may include an n-type semiconductor layer, a p-type semiconductor layer, and a well layer. The first LED stack 23 may include an AlGaInP-based well layer, the second LED stack 33 may include an AlGaInN-based well layer, and the third LED stack 43 may include an AlGaInP-based or AlGaInN-based well layers.

(Step 201)

In Step 201, a performance measurement is carried out for each wafer in the first group. The performance measurement for locations in each wafer is carried out, and whether each location is defective or not may be determined using the measured value. For example, as illustrated in FIG. 3, it is checked whether each of regions 23m of the first LED stack 23 grown on the first wafer 210 is defective or not. The result of checking whether each location is defective or not may be stored and mapped so that it can be checked visually by a user. In some forms, the mapped data can be displayed on a screen or printed on a tangible medium and can be visually inspected by a user. A user may see displays of the wafers 210(R1), 310(B1), and/or 410(G1) on the screen as illustrated in FIGS. 3-5 and defective regions 23m may be distinctly displayed. As illustrated in FIGS. 4 and 5, the same performance measurement and mapping for each of regions 33m and 43m may be carried out for the second wafer 310 and the third wafer 410.

An area for each location, such as the regions 22m, 33m, and 43m shown in FIGS. 3-5, for determining whether there is a defect or not may be arbitrarily set, and performance of a measuring tool may be considered. For example, a light emission wavelength at each location is measured using PL (photoluminescence), through which whether each location is defective or not may be determined. In this case, a size of the measurement location may be determined by a PL beam size. In addition, it is determined whether there are defects at every location on the first wafer 210 where light emitting devices are to be fabricated, by measuring the emission wavelengths for predetermined locations.

It is possible to determine whether each location is defective or not, by pre-determining a favorable wavelength range. For example, when the emission wavelength measured using the PL is out of a certain range from a target wavelength, it may be determined as defective. A certain range may be set to be, for example, 2 nm or the like, or may be set to be a ratio of 1% or 0.5% of the target wavelength.

In Step 201, the performance measurement of all the wafers in the first group is completed, and whether each location of each wafer is defective or not is determined. According to the above results, a yield of each wafer may also be extracted.

(Step 301)

In Step 301, combination yields of the first group of wafers are calculated. The combination yields of the wafers may provide different and more information than an individual yield of each wafer. As the first, the second, and the third wafers 210, 310, and 410 are stacked on one another to fabricate the light emitting device, the light emitting devices fabricated by stacking the first, the second and the third wafers 210, 310, and 410 may have a lower yield than that of each of the wafers 210, 310, and 410 in some instances. As previously described in connection with FIG. 1, since defective locations 23f, 33f, and 43f in the wafers 210, 310, and 410 may be different from one another, the light emitting devices fabricated by stacking these wafers may have a considerably low yield.

The method of fabricating a light emitting device according to the teachings of the present disclosure includes forming a test stacked structure by combining one of the first wafers 210, one of the second wafers 310, and one of the third wafers 410 such that a combination yield of the test stacked structure is calculated based on a count of defective measurement locations that overlap in the test stacked structure. Each combination yield of each test stacked structure will be compared and one or more resultant combinations of the first, the second and the third wafers 210, 310, and 410 will be selected. A final stacked structure can be fabricated with the resultant combinations that provide higher yields.

There are various manners in which the combination yields are calculated. In an exemplary embodiment, all possible cases of combinations may be considered, as will be described below. More particularly, a yield of each combination may be calculated through all possible combinations of the first, second, and third wafers 210, 310, and 410 in the first group, through which total combination yields may be derived. For the combinations of wafers in the first group, a plurality of total combination yields may be derived, and combinations of wafers providing a maximum combination yield may be identified among the total combination yields. This will be described in detail with reference to FIGS. 6A and 6B.

FIGS. 6A and 6B are tables for showing yields according to combinations of wafers. Herein, the first, second, and third wafers 210, 310, and 410 included in the first group are grouped as R group (RG; R1 through R12), B group (BG; B1 through B12, and G group (GG; G1 through G12), respectively. Herein, each of the R group, B group, and G group includes 12 wafers, and R1 through R12, B1 through B12, and G1 through G12 represent respective wafers, but as described above, the inventive concepts are not limited thereto. As will be described below in conjunction with FIG. 7, one of the 12 first wafers, one of the 12 second wafers, and one of the 12 third wafers, will be selected and combined. Such combinations of selected wafers correspond to each row of the tables in FIGS. 6A and 6B.

As illustrated in FIG. 6A, one total combination is provided by 12 combinations C1 through C12 using the first, second, and third wafers 210, 310, and 410. Each yield (Yd; Y1 through Y12) for the combinations C1 through C12 may be calculated based on whether each location of each wafer is defective or not, which was determined previously, and a total combination yield Yt1 may be calculated by summing these yields.

More specifically, each individual wafer has one or more locations to be measured for the performance. After the measurement, it is determined which locations are defective or which locations are not defective. The information for the defective locations on each individual wafer is sufficient for calculating the combination yield as will be further described below. Here, the "yield" means a percentage (%) ratio of good locations to a total locations. The yield of each individual wafer can be determined based on the measurement results, but the yield of the individual wafer may not be used for calculating the combination yield.

By way of example, calculation for a combination yield C1 for the combination of R1, B1, and G1 wafers is described. For convenience of explanation, it is assumed that there are hundred (100) locations for each individual wafer, and ten (10) defective locations for each individual wafer. The combination yield depends on how many overlaps among the defective locations on each individual wafer in the combination are. More specifically, by way of example only, if ten (10) defective locations of the R1 wafer, ten (10) defective locations of B1 wafer, and ten (10) defective locations of G1 wafers overlap all together, a combination yield of the combination of R1, B1, and G1 wafers is 90%. That is, the combination yield of the combination of R1, B1, and G1 equals to 100*(100−10)/100. If there is no overlap between the defective locations of the R1, B1, and G1 wafers, then there will be 30 defective locations for the combination of the R1, B1, and G1 wafers. Thus, the combination yield will be 70% based on the calculation of 100*(100−30)/100. Therefore, as described above, the combination yield can be calculated based on the information of the defective locations for the three wafers.

The total combination yield Yt1 is a total combination yield obtained when the first, second, and third wafers 210, 310, and 410 are combined in the combination C1 through C12 as illustrated in FIG. 6A. Meanwhile, when they are combined differently from FIG. 6A, the yield Yd for each combination may be changed, and thus, the total combination yield Yt will also be changed. For example, as illustrated in FIG. 6B, even when only an order of the second wafers 310 is changed, combinations completely different from those of FIG. 6A are formed, and accordingly, a new total combination yield Yt2 is calculated.

When the number of the first wafers 210, the second wafers 310, and the third wafers 410 is n, respectively, possible combinations may be $(n!)^2$ combinations. More particularly, by way of example, when the number of the first, second, and third wafers 210, 310, and 410 is 12, respectively, total combination yields of $(12!)^2$ can be calculated. Among these total combination yields of $(12!)^2$, 12 combinations C1 through C12 representing the maximum combination yield can be determined and selected. The maximum combination yield is the maximum combination yield that can be obtained by combining the first, second, and third wafers 210, 310, and 410 in the first group in one or more certain orders, and yields of light emitting devices may be maximized by carrying out a subsequent process with these combinations.

In other embodiments, each number of the first wafers 210, the second wafers 310, and the third wafers 410 may be different. One of the first wafers 210, the second wafers 310, and the third wafers 410 are selected and combined to make a stacked structure. When the first, second and third wafers have different numbers, the total combination should be made with a same number of wafers. For example, there are ten (10) first wafers, fifteen (15) second wafers, and twenty (20) third wafers, their combination yields will be calculated from 10 first wafers, 10 second wafers selected from the 15 second wafers, and 10 third wafers selected from the 20 third wafers. In addition, all combinations of the first, second, and third wafers 210, 310 and 410 may be considered such that the combination yields of all combinations of the wafers 210, 310 and 410 can be calculated with respect to the 10 first wafers, 15 second wafers, and 20 third wafers. In other words, with respect to the 10 first wafers, all of 15 second wafers and all of 20 third wafers will be considered to make different combinations and for each different combination, the combination yield will be calculated.

In some forms, the calculation of the above combination yields may be performed using a computational program. The computational program may calculate the yield of each combination by performing an operation based on the measurement result of each of the first, second, and third wafers 210, 310, and 410. The computational program may be performed using an operation device such as a computer system, and the operation may be performed based on the measurement result for each wafer. The computational program may be stored in a computer-readable recording medium.

In another exemplary embodiment, another method may be considered in addition to the method of considering all possible combinations as described above. For example, to reduce the number of cases, an order of one type of wafers may be fixed, and combinations of the remaining wafers may be considered. In some forms, the order of the first wafers is fixed and total combination numbers are determined by the combination of the second wafers and the third wafers.

For example, the first wafers R1 through R12 may be arranged in order of high yield, and a combination having a highest yield may be derived in this order. More particularly, first, combination yields Y1 through Y12 are calculated for all combinations of the first wafer R1 having the highest yield among the first wafers R1 through R12 with the second wafers B1 through B12 and the third wafers G1 through G12, and a combination with a highest combination yield Y1 among them is determined. When a combination selection for the first wafer R1 is completed, a combination representing an optimum yield Y2 for the first wafer R2 is determined through the same manner with the second wafers and third wafers except for the second wafer and the third wafer combined with the first wafer R1. In this way, all combinations C1 through C12 representing the yields from the highest yield Y1 to a lowest yield Y12 may be determined. According to this method, the number of combinations for which the yields are to be calculated may be significantly reduced compared to that of the previous case.

Although the first wafers R1 through R12 are described above as being fixed in advance in order of high yield, the second wafers B1 through B12 may be fixed in advance in order of high yield, or the third wafers G1 through G12 may be fixed in advance in order of high yield. In particular, the order of wafers having relatively high yields among the first, second, and third wafers 210, 310, and 410 may be fixed in advance.

(Step 401)

In Step 401, combinations of wafers on which the process is to be performed are determined based on the calculation of the combination yields of the first, second, and third wafers 210, 310, and 410 in the first group. In an exemplary embodiment, the combinations of wafers on which the process is to be performed may be determined with a total combination of C1 through C12 representing a maximum combination yield Yt among all possible combinations. In another exemplary embodiment, the wafer combinations on which the process is to be performed may be determined with all combinations in which the order of the first wafers R1 through R12 is fixed in advance and individual combination yields Yd are arranged in order of high yield according to this order.

(Step 501)

In Step 501, the process is carried out according to the determined combinations of wafers to fabricate light emitting devices. The processes may include forming an electrode on each wafer, and may also include bonding the wafers 210, 310, and 410 to one another. Furthermore, after the wafers are bonded to one another, at least one of the substrates 21, 31, and 41 may be removed.

Fabricating light emitting devices using the first, second, and third wafers 210, 310, and 410 may be performed in various ways using known techniques.

Figure 7:
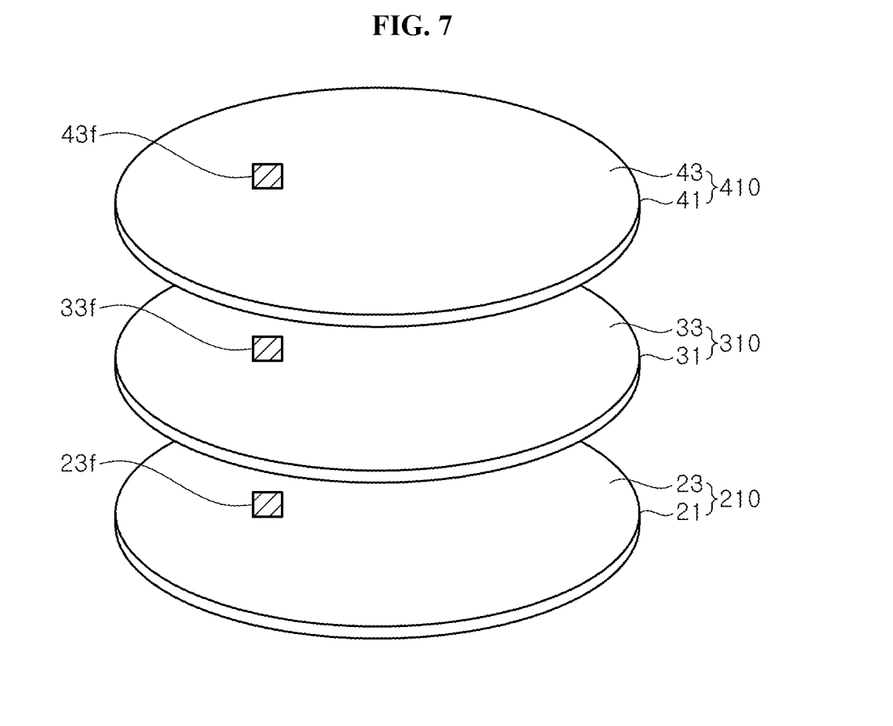
FIG. 7 is a schematic perspective view illustrating a method of fabricating a light emitting device having a stacked structure according to one or more embodiments of the present disclosure.

FIG. 7 is a schematic perspective view illustrating a method of fabricating a light emitting device having a stacked structure according to an exemplary embodiment.

Referring to FIG. 7, a first wafer 210 may generally include at least one defective location 23*f*. A second wafer 310 and a third wafer 410 may also include defective locations 33*f* and 43*f*, respectively.

According to the method of fabricating a light emitting device according to an exemplary embodiment, combinations of wafers in which the defective locations 23*f*, 33*f*, and 43*f* of the first wafer 210, the second wafer 310, and the third wafer 410 are arranged at an identical location may be selected. As shown in FIG. 7 at least one of the defective locations of each wafer is set to be overlapped with the defective location of another wafer, and a manufacturing yield of the light emitting device may be improved compared to combinations of wafers in which the defective locations thereof are not overlapped.

Meanwhile, although it is illustrated that the second wafer 310 is disposed on the first wafer 210, and the third wafer 410 is disposed thereon, the inventive concepts are not limited thereto. For example, the second wafer 310 may be disposed on the third wafer 410, and the first wafer 210 may be disposed thereon.

In addition, when the wafers are bonded, the present disclosure is not limited to all substrates 21, 31, and 41 disposed below as illustrated in FIG. 7. For example, when the second wafer 310 is bonded onto the first wafer 210, the substrate 31 of the second wafer 310 may be disposed opposite to the first wafer 210. After the second wafer 310 is bonded onto the first wafer 210, the substrate 31 may be removed using a laser lift-off technique, for example. In this case, a corresponding measurement location of the second wafer 310 with respect to each measurement location of the first wafer 410 is opposite to that in the case where the substrate 31 faces the first wafer 210. Therefore, considering the wafer bonding method in the process, the yields of the combinations of wafers need to be calculated.

Meanwhile, although the process may be performed on the combinations of all the wafers 210, 310, and 410 in the first group, all the wafers may not be used in fabricating light emitting devices. For example, wafers of a combination in which a combination yield Yd is less than or equal to a reference value may be held or discarded. The reference value may be set to be 50%, further, 60%, or 70%, for example.

Meanwhile, discarding all of the wafer combinations in the first group each having a combination yield less than the reference value may cause losses. For example, there might be a case that a yield of one wafer may be very low and yields of other wafers may be relatively favorable, or there might be a case that, even though a yield of each of wafers is relatively favorable, a combination yield of the wafers may be relatively low because defective locations are not overlapped with one another. In this case, when the process is performed using the wafers of these combinations, the yield of the light emitting devices is poor, resulting in a greater process loss. Hereinafter, a method of utilizing the wafers in the first group will be described.

Figure 8:
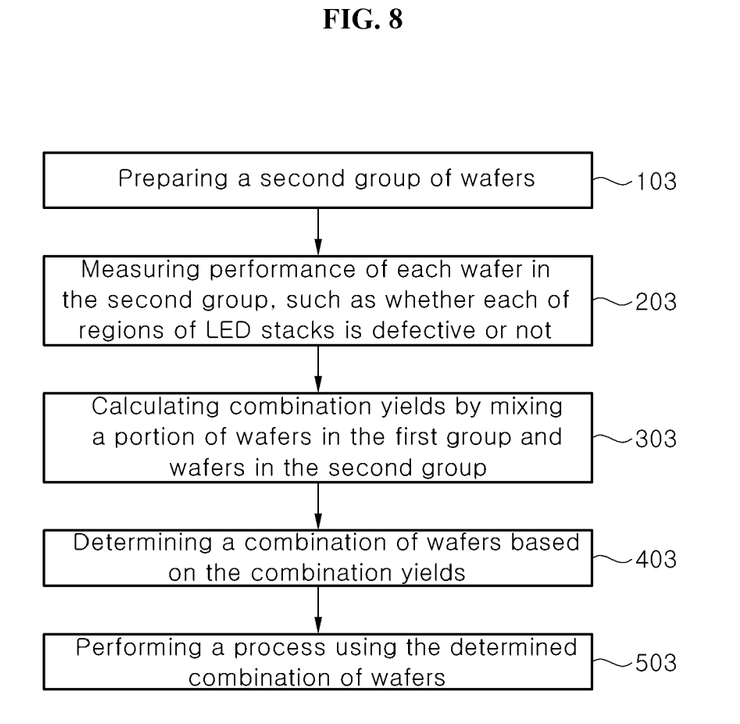
FIG. 8 is a schematic flowchart illustrating a method of fabricating a light emitting device having a stacked structure according to one or more embodiments of the present disclosure.

FIG. 8 is a schematic flowchart illustrating a method of fabricating a light emitting device having a stacked structure according to an exemplary embodiment. Herein, the method of fabricating a light emitting device will be described together with the flow chart described with reference to FIG. 2.

(Step 103)

In Step 103, a second group of wafers is prepared. The second group of wafers include first wafers 210, second wafers 310, and third wafers 410 as the first group of wafers. However, the second group of wafers are wafers that do not belong to the first group and are distinguished from the first group of wafers. For example, the second group of wafers may be prepared through a different run from that for the first group of wafers.

The numbers of the first wafers 210, the second wafers 310, and the third wafers 410 included in the second group are not particularly limited. In addition, the first, the second, and the third wafers 210, 310, and 410 may be prepared in an identical number to one another, but may be prepared in different numbers from one another.

(Step 203)

In Step 203, a performance measurement for each wafer in the second group is carried out. The performance measurement for locations in each wafer is carried out, and whether there is a defect at each location or not may be determined using the measured value. As previously described with reference to FIGS. 3, 4 and 5, it is checked whether or not each of regions 23$m$, 33$m$, and 43$m$ of the first, second, and third LED stacks 23, 33, and 43 grown on the first, second, and third wafers 210, 310, and 410 is defective, and the result of checking of whether each location is defective or not, may be stored. The defect and the corresponding location are mapped so that it can be checked visually.

In Step 203, the performance measurement of all the wafers in the second group is completed, and whether each location of each wafer is defective or not is determined. According to the above results, a yield of each wafer may also be extracted.

(Step 303)

In Step 303, wafer combination yields are calculated by mixing a portion of first group of wafers and the second group of wafers. For example, as described above, at least a portion of first group of wafers among the wafer combinations of the first group having combination yields less than the reference value may be merged into the wafers of second group, and total combination yields thereof may be calculated. As described above, the combination yields may be obtained by calculating the total combination yields for all combinations of all wafers, or by fixing an order of any one of the first, second, and third wafers 210, 310, 410 in advance and calculating an optimum yield of each combination.

(Step 403)

In Step 403, a total combination of wafers consisting of the portion of first group of wafers and the second group of wafers is determined based on the previously calculated yields. As such, the wafers may be combined such that the total combination of wafers may achieve the optimum yield.

(Step 503)

In Step 503, the process is carried out according to the determined combinations of wafers to fabricate light emitting devices. Since the process of fabricating light emitting devices for the combinations of wafers is the same as described above, detailed descriptions thereof will be omitted. In addition, it is not required to carry out the process of fabricating light emitting devices for all combinations including all or a portion of first group of wafers, all or a portion of the second group of wafers, or both, but some of these wafers may be discarded, or merged with wafers of other groups.

According to the illustrated exemplary embodiment, the wafers each having a relatively low combination yield among the wafers in the first group are merged with the wafers in the second group, and it is possible to reduce wafer loss by reducing discarded wafers and improving the yield.

Meanwhile, in various exemplary embodiments, individual combination yields Yd and total combination yields Yt according to various combinations of the first wafers R1 through R12, the second wafers B1 through B12, and the third wafers G1 through G12 included in the first group may be calculated using a computational program. This computational program calculates a yield according to a combination of the first, second, and third wafers 210, 310, and 410 based on a measurement value at each location of the wafer or based on a determination as to whether there is a defect according to the measurement value. For example, the combination yields of R1, B1, and G1 in which the first wafer R1, the second wafer B1, and the third wafer G1 are combined represent percentage of the number of measurement locations where favorable measurement locations in all 3 wafers overlap when the three wafers are bonded, with respect to the total number of measurement locations in one wafer. The computational program may calculate the combination yields using the data on the stored measurement location, calculate the combination yields for all possible combinations, and calculate the total combination yields Yt accordingly.

By using the computational program, the calculation of the combination yields may be carried out quickly, and thus, the process time depending on the process of calculating the combination yields may be reduced. Furthermore, as described above, the number of combinations calculated may be reduced by fixing the orders of the group of first wafers RG, the group of second wafers BG, or the group of third wafers GG in advance.

The computational program may be integrated into a computer system to perform the procedure for calculating the combination yields. Typically, the computer system may include a central processing unit (CPU), memory, and input/output interfaces. The computer system may be a special-purpose computer system or a general-purpose computer system.

The computer system is generally coupled with an output apparatus such as a display or various input apparatuses such as mouses and keyboards through I/O interfaces. In addition, the computer system may include various circuits such as cache, power supplies, clock circuits, and a communication bus.

The display may aid a user's visual understanding by displaying the measurement result of each wafer or the combination yields according to the combinations of wafers, for example, in a wafer map.

A memory 420 may include a random access memory (RAM), a read only memory (ROM), a disk drive, a tape drive, or a combination thereof.

The computational program may be stored in an internal or external memory, or may be stored in the computer as software, and may be executed by the CPU.

The light emitting device described herein may be a display apparatus called a micro LED or a mini LED. The light emitting device may be used in a large display apparatus such as an LED TV, a VR display apparatus such as a smart watch 1000*a*, a VR headset 1000*b*, or an AR display apparatus such as augmented reality glasses 1000*c*.

Although some embodiments have been described herein, it should be understood that these embodiments are provided for illustration only and are not to be construed in any way as limiting the present disclosure. It should be understood that features or components of an exemplary embodiment can also be applied to other embodiments without departing from the spirit and scope of the present disclosure.

The invention claimed is:

1. A method of fabricating a light emitting device having a stacked structure, comprising:
   measuring an emission wavelength for each predetermined measurement location of each wafer a first group of wafers, wherein the first group of wafers comprises a plurality of first wafers, a plurality of second wafers, and a plurality of third wafers, and a set of wafers comprises at least one of the first wafers, at least one of the second wafers, and at least one of the third wafers;
   determining whether each measurement location is defective or not based on a measurement result of the emission wavelength of each location;
   forming a test stacked structure by combining said one of the first wafers, said one of the second wafers, and said one of the third wafers;
   calculating a combination yield of the test stacked structure based on a count of defective measurement locations that overlap in the test stacked structure;
   selecting one or more resultant combinations of the first, the second and the third wafers by comparing each combination yield of the test stacked structure; and
   performing a subsequent process using the resultant combinations of the first, the second and the third wafers, wherein the subsequent process comprises forming a final stacked structure with the selected resultant combinations of first, the second and the third wafers.

2. The method of fabricating a light emitting device of claim 1, wherein:
   performing the subsequent process further comprises performing the subsequent process on the combinations of first, the second and the third wafers, where each combination has a combination yield greater than or equal to a reference value.

3. The method of fabricating a light emitting device of claim 1, further comprising:
   determining each yield of each wafer in the first group based on the measurement result of the emission wavelength of each location.

4. The method of fabricating a light emitting device of claim 1, wherein determining whether each location is defective or not further comprises determining whether or not the measurement result of the emission wavelength of each location is in a preset range from a target wavelength.

5. The method of fabricating a light emitting device of claim 1, wherein measuring the emission wavelength further comprises measuring the emission wavelength using photoluminescence.

6. The method of fabricating a light emitting device of claim 1, further comprising:
   sorting the plurality of first wafers to follow a selected order;
   wherein forming the test stacked structure further comprises forming the test stacked structure by combining each first wafer following the sorted order with each second wafer and each third wafer selected in random order, respectively.

7. The method of fabricating the light emitting device of claim 1, wherein each first wafer having a first substrate and a first LED stack grown on the first substrate;
   each second wafer having a second substrate and a second LED stack grown on the second substrate; and
   each third wafer having a third substrate and a third LED stack grown on the third substrate,
   wherein the first, second, and third LED stacks are configured to emit light of different colors from one another.

8. The method of fabricating the light emitting device of claim 7, wherein:
   the first LED stack is configured to emit red light,
   the second LED stack is configured to emit blue light,
   the third LED stack is configured to emit green light, and
   the second LED stack is disposed between the first LED stack and the third LED stack.

9. The method of fabricating the light emitting device of claim 7, wherein:
   the first LED stack is configured to emit red light,
   the second LED stack is configured to emit green light,
   the third LED stack is configured to emit blue light, and
   the second LED stack is disposed between the first LED stack and the third LED stack.

10. The method of fabricating the light emitting device of claim 1, further comprising:
    preparing the first group of wafers including a total of n first wafers, a total of m second wafers, and a total of k third wafers,
    wherein n, m and k are natural numbers greater than zero.

11. The method of fabricating the light emitting device of claim 10, wherein: where m and k are equal to n, forming the test stacked structure further comprises forming the test stacked structure that include $(n!)^2$ different combinations of the first wafers, the second wafers, and the third wafers.

12. The method of fabricating the light emitting device of claim 11, wherein:
    calculating the combination yield of the test stacked structure further comprises calculating the combination yield of all or a part of the $(n!)^2$ different combinations based on the count of defective measurement locations that overlap in each test stacked structure.

13. The method of fabricating the light emitting device of claim 12, wherein:
    selecting the resultant combinations further comprises comparing the combination yield for all or a part of the $(n!)^2$ different combinations of the first wafers, the second wafers, and the third wafers.

14. The method of fabricating the light emitting device of claim 12, further comprising:
    calculating total combination yield Yt by summing the combination yield of all of a part of the $(n!)^2$ different combinations of the first wafers, the second wafers, and the third wafers.

15. The method of fabricating a light emitting device of claim 1, wherein:
selecting the resultant combinations further comprises selecting the resultant combinations of the first, the second and the third wafers in the order of a highest combination yield.

16. The method of fabricating a light emitting device of claim 10, further comprising:
where m is greater than n:
selecting n sets of wafers from the first group of wafers;
calculating the combination yield of the test stacked structure based on the n sets of wafers;
selecting (m−n) sets of wafers from the first group of wafers; and
calculating the combination yield of the test stacked structure based on the (m−n) sets of wafers.

17. The method of fabricating a light emitting device of claim 1, comprising:
preparing a second group of wafers including wafers of identical types to types of the first group of wafers;
measuring the emission wavelength for each predetermined measurement location of each wafer in the second group of wafers;
forming another test stacked structure by combining a portion of the wafers in the first group and the wafers in the second group; and
calculating combination yields of another test stacked structure based on a count of defective measurement locations that overlap in another test stacked structure.

* * * * *